United States Patent [19]

Park et al.

[11] Patent Number: 5,729,178
[45] Date of Patent: Mar. 17, 1998

[54] FULLY DIFFERENTIAL FOLDED CASCODE CMOS OPERATIONAL AMPLIFIER HAVING ADAPTIVE BIASING AND COMMON MODE FEEDBACK CIRCUITS

[75] Inventors: Hong-June Park, Pohang-shi; Jae-Yoon Sim, Kwangju, both of Rep. of Korea

[73] Assignee: Postech Foundation, Rep. of Korea

[21] Appl. No.: 626,817

[22] Filed: Apr. 3, 1996

[30]     Foreign Application Priority Data

Apr. 4, 1995  [KR]  Rep. of Korea ............... 95-7824

[51] Int. Cl.$^6$ ................................................ H03F 3/45
[52] U.S. Cl. ......................... 330/258; 330/253; 330/257; 330/261
[58] Field of Search ............................. 330/253, 255, 330/257, 258, 261

[56]     References Cited

U.S. PATENT DOCUMENTS 5,412,343  5/1995  Rijns ................................. 330/258

Primary Examiner—James B. Mullins
Attorney, Agent, or Firm—Anderson Kill & Olick, P.C.

[57]     ABSTRACT

An adaptive biasing circuit is combined to a fully differential cascode operational amplifier ("OP AMP") to eliminate the effect of a slew rate, thereby increasing the operation speed of the OP AMP while maintaining a high DC voltage gain. A common mode feedback circuit with a large input common mode voltage range is also connected to the OP AMP, thereby maximizing a linear output voltage swing range. The common mode feedback circuit comprises a nMOS input stage differential amplifier and a pMOS input stage differential amplifier which are connected in parallel, and a push-pull CMOS amplifier for converting current outputs from the nMOS and the pMOS input stage differential amplifiers to an output voltage signal. The adaptive bias circuit comprises an operational transconductance amplifier, two current subtractor circuits and four output transistors.

4 Claims, 14 Drawing Sheets

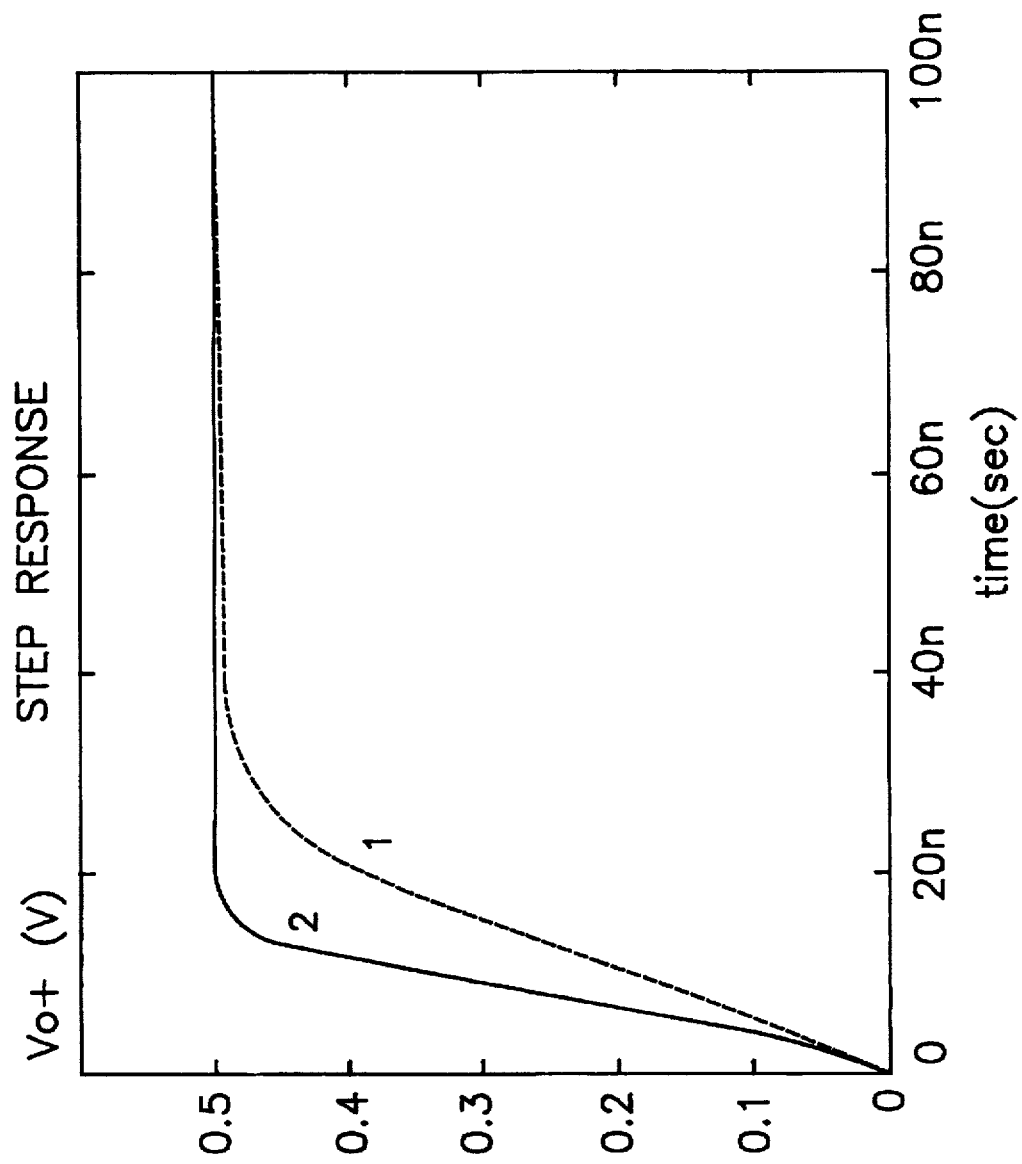

FULLY DIFFERENTIAL FOLDED CASCODE CMOS OPERATIONAL AMPLIFIER HAVING ADAPTIVE BIASING AND COMMON MODE FEEDBACK CIRCUITS

FIELD OF THE INVENTION

The present invention relates to a low voltage Complementary Metal-Oxide-Semiconductor ("CMOS") operational amplifier ("OP AMP"); and, more particularly, to a fully differential folded cascode CMOS OP AMP employing an adaptive bias circuit and a common mode feedback ("CMFB") circuit.

DESCRIPTION OF THE PRIOR ART

The rapidly increasing complexity in chip structure has exacted a need to implement complete analog-digital subsystems on a same integrated circuit using a same manufacturing technology. For this reason, implementation of certain analog functions in Metal-Oxide-Semiconductor ("MOS") technology has become increasingly important.

OP AMPs are key elements to most analog subsystems, particularly in switched capacitor filters, and performance of such subsystems is strongly influenced by the OP AMP characteristics.

In designing an OP AMP, it is important to consider various advantages and drawbacks associated with each of the amplifier configurations such as common emitter ("CE"), common base ("CB") and common collector ("CC"). For instance, a specific property of the amplifier configuration can be enhanced, a certain deficiency can be remedied and/or a special feature can be added by combining two configurations, e.g., CC-CC, CC-CE, CC-CB, CE-CE and CE-CB.

The CE-CB configuration, usually referred to as a cascode amplifier, has basically the same input characteristics as the CE amplifier and the same output characteristics as the CB amplifier. Specifically, it has high output resistance, which is useful in achieving a large amount of voltage gain. Moreover, in this configuration, no high frequency feedback occurs from the output to the input, and an input Miller capacitance effect is at a minimum because the voltage gain of the CE configuration is very low. Therefore, the CE-CB (or cascode) configuration is inherently stable and hence ideally suited for high-frequency applications.

Referring to FIG. 1, there is shown a circuit diagram of a conventional fully differential folded cascode CMOS OP AMP 1.

As shown, it comprises two input voltage terminals ($V_{in+}$, $V_{in-}$), two output voltage terminals ($V_{o+}$, $V_{o-}$), two power supply terminals ($V_{dd}$, $V_{ss}$), four DC bias voltage terminals (A, B, C, D), a CMFB voltage terminal (VCM), seven NMOS transistors (M1, M2, M3, M8, M9, M10, M11), and four PMOS transistors (M4, M5, M6, M7).

Assuming that channel width-to-length ratios of M1, M4, M6, M8 and M10 are the same as those of M2, M5, M7, M9 and M11 in that order and all transistors operate in their respective saturation region, a differential voltage gain $A_v$ defined as $$A_v \equiv \frac{V_{o+} - V_{o-}}{V_{in+} - V_{in-}} \quad \text{Eq. 1}$$

can be represented as follows:

$$A_v = g_{m1} \cdot R_o \quad \text{Eq. 2}$$

wherein $V_{in+}$ and $V_{in-}$ in Eq. 1 are input voltages which are applied to the input terminals with the same names, $V_{o+}$ and $V_{o-}$ in Eq. 1 are output voltages which are generated on the output terminals with the same names, $g_{m1}$ is a transconductance value of M1, $R_o$ represents an output resistance, i.e., an equivalent resistance that can be measured between an output terminal $V_{o+}$ or $V_{o-}$ and the ground. The output resistance $R_o$ may be calculated as:

$$R_o = \{r_{o10} \cdot g_{M8} \cdot r_{o8}\} \| \{(r_{o4} \| r_{o1}) \cdot g_{M6} \cdot r_{o6}\} \quad \text{Eq. 3}$$

wherein $g_{M6}$ and $g_{M8}$ are the transconductance values of M6 and M8, respectively; and $r_{o1}$, $r_{o4}$, $r_{o6}$, $r_{o8}$ and $r_{o10}$ are output resistance values of M1, M4, M6, M8 and M10 in that order. The vertical double bar signifies a parallel connection of two elements while it may be represented mathematically as:

$$X \| Y = \frac{X \times Y}{X + Y} \quad \text{Eq. 4}$$

It should be noted that the output resistance value is increased by a factor of the intrinsic voltage gain of M6 and M8, making the overall voltage gain of the amplifier a large value. The OP AMP shown in FIG. 1 operates as a single stage amplifier and, therefore, does not need extra capacitive loads for a frequency compensation except those connected to the output terminal $V_{o+}$ or $V_{o-}$, thereby ensuring improved frequency characteristics and a fast operation.

However, in the fully differential folded cascode amplifier of FIG. 1, a maximum range of output current is restricted by a bias current value of the nMOS transistor M3. Therefore, in case that a large differential input voltage is applied, operation of the amplifier tends to slow down. This slowing down can be represented in terms of a slew rate which is defined as the maximum rate of change of output voltage per unit time and indicates the speed of change in the output of an OP AMP in response to a change in the input frequency. The slew rate of an OP AMP is fixed; and, therefore, if the slope requirement of the output signal is greater than the slew rate, then distortion occurs. Thus, the slew rate is one of the important factors in designing OP AMPs particularly for high frequency applications. The slew rate is controlled by the level of limitation in a tail current source of an OP AMP. An adaptive biasing method may be adopted to improve the slew rate by providing more tail current. Adaptive biasing OP AMPs are described in, e.g., M. G. Degrauwe et al, "Adaptive Biasing CMOS Amplifiers", *IEEE Journal of Sold-State Circuits*, sc-17, 3 (June, 1982).

Referring to FIG. 2, there is provided a circuit diagram of a prior art operational transconductance amplifier ("OTA") adopting a conventional adaptive bias circuit. The circuit shown in FIG. 2 represents one of the adaptive biasing amplifiers, which is also referred to as a differential feedback amplifier.

The OTA circuit of FIG. 2 includes 13 nMOS transistors (Ma1, Ma2, Ma9–Ma17, Ma20, Ma21), eight pMOS transistors (Ma3–Ma8, Ma18, Ma19), two input voltage terminals ($V_{in+}$, $V_{in-}$), a voltage output terminal ($V_o$), two supply voltage terminals ($V_{dd}$, $V_{ss}$) and a DC bias voltage terminal (E).

To summarize an operation of the input bias circuit in the OTA of FIG. 2, responsive to a large difference between input voltages $V_{in+}$ and $V_{in-}$, one of the nMOS transistor Ma12 or Ma14 is turned on to supply a large amount of current to thereby increase the bias current for the input transistors Ma1 and Ma2. Consequently, the current flowing through either of the output transistors Ma19 and Ma21 is increased and the slew rate is boosted.

During the operation, pMOS transistors Ma4, Ma6 and Ma8 form current mirrors. A current mirror is a circuit in which an output current is forced to equal its input current. Accordingly, in the current mirror circuit, the output current is a mirror image of the input current.

Therefore, the current fed from either of the transistors Ma6 and Ma8 is of a same value I2 as that of Ma4 and Ma2, assuming that the output resistance of the MOS transistors is infinite and that the OTA works in a linear operation mode, i.e., all MOS transistors thereof operate in a saturation region and the transistors M4, M6, and M8 have a same channel width-to-length ratio.

With a similar assumption, it can be readily concluded that the current from either of the transistors Ma5 and Ma7 is of a same value I1 as that of Ma3 and Ma1.

The four transistors Ma14 to Ma17 form a current subtraction circuit which is separately shown in FIG. 3. In FIG. 3, transistors Ma16 and Ma17 form another current mirror, equalizing the current fed through the transistor Ma16 as that of Ma17, i.e., I2. Since the sum of the currents fed to the transistors Ma15 and Ma16 is I1, the current fed to Ma15 is (I1-I2) when I1 is larger than I2 but is 0 when I1 is smaller than I2. In the latter case, the transistors Ma15 and Ma16 fall out of their respective saturation region. The transistors Ma14 and Ma15 also form a current mirror. Therefore, with the channel width-to-length ratio of Ma14 being B times that of Ma15, the current value fed to the transistor Ma14 is B·(I1-I2) when I1 is larger than I2 and is 0 when I1 is smaller than I2.

Similar remarks may be made with respect to another current subtraction circuit consisting of Ma9 to Ma12 except that the transistor Ma12 is turned on when I2 is larger than I1. Therefore, assuming that the channel width-to-length ratio of Ma12 is B times larger than that of Ma11, the current value fed to the transistor Ma12 becomes B·(I2-I1) when I2 is larger than I1 and is 0 when I2 is smaller than I1.

Referring back to FIG. 2, with substantially same values of $V_{in+}$ and $V_{in-}$, I1 and I2 are also equal, assuming that the effect of input offset voltages is negligible. It then follows that the current values through Ma12 and Ma14 are almost 0 and the bias current values of Ma1 and Ma2 are determined by the transistor Ma13 acting alone as a current source.

When an input voltage fluctuation caused by a limited slew rate brings about a difference between I1 and I2 (i.e., the current values of the input transistors Ma1 and Ma2), either of the transistors Ma12 and Ma14 will be turned on. The current induced by one of the transistors Ma12 and Ma14 works as a positive feedback to make the value of I1 or I2 large while the effect of the limited slew rate is lingering.

In such event, a current proportional to I2 will run through the transistor Ma19 which forms a current mirror together with the transistor Ma4, while the current running through the transistor Ma21 is proportional to I1 with the help of a current mirror comprised of Ma3 and Ma18 and another current mirror made of Ma20 and Ma21.

While the circuit shown in FIG. 2 has the advantage of low power consumption during a steady state, it also provides a large current at the output terminal $V_o$ when the input voltages are different from each other. Since a negative feedback loop is usually employed from the output to the input, the large output current lessens the input voltage difference, thereby increasing the slew rate. However, it does not provide a fast settling time due to its complex structure. Moreover, without some modifications, it is not suitable to be incorporated into a folded cascode circuit.

As is well known, an output balancing is indispensable for a fully differential OP AMP. A balanced output differential amplifier circuit is a circuit wherein a pair of input signals is applied and an amplified pair of balanced output signals emerges therefrom. That is, in response to a pair of input voltage signals VI1 and VI2, such an amplifier produces a balanced pair of amplified output signals V01 and V02 that are substantially equal in magnitude and opposite in polarity: (V02-V01)=G(VI1-VI2), where G is the gain of the amplifier, and, at the same time, V01+V02=0, or, V01=-V02, regardless of the values of the input voltage signals VI1 and VI2. It can be noticed that this situation of balanced outputs is a case of rejection of a common mode component by an amplifier: that is, in response to any two inputs VI1 and VI2 that are equal (VII=VI2), the outputs V01 and V02 are both zero (V01=V02=0).

The balanced output amplifier ensures that in response to any increments DI1 and DI2 in the input voltages, respectively, the corresponding increments D01 and D02 in the outputs will substantially satisfy the relation D01+D02=0. Thus, any nonlinearity in the amplifier's response, which would otherwise make the absolute magnitude of D01 differ from D02, will be compensated.

In summary, a balanced output OP AMP is a special case of a differential output amplifier wherein a common mode component, i.e., an average value of two output terminal voltages, is set to a predetermined value, e.g., 0, as is often the case. An accurate output balancing is important for achieving maximum benefits from different circuits in actual nonideal situations. This is because such a balancing ensures that the output will not be affected by a common mode component that could otherwise be present due to, e.g., a circuit nonlinearity or power supply noise.

The OP AMP employing an output balancing circuit, or a CMFB circuit, is described in, e.g., Mihai Banu et al., "Fully Differential Operational Amplifier with Accurate Output Balancing", *IEEE Journal of Solid State Circuits*, 23, 6 (December 1988).

Referring to FIG. 4, there is shown a prior art CMFB circuit including a MOS differential input stage, wherein the CMFB method is utilized for implementing a balanced output OP AMP.

As shown in FIG. 4, the prior art CMFB circuit 6 includes 6 pMOS transistors (Mb1-Mb6) and 2 nMOS transistors (Mb7-Mb8). The CMFB circuit of FIG. 4 is to be incorporated into the conventional OP AMP shown in FIG. 1 so that two input terminals V1 and V2 are connected to the output terminals $V_{o+}$ and $V_{o-}$ of the fully differential folded cascode CMOS OP AMP shown in FIG. 1 and an output terminal VCM is connected to the terminal VCM of the OP AMP shown in FIG. 1. A DC voltage bias terminal F and two power supply terminals denoted as $V_{dd}$, $V_{ss}$ are also included in the CMFB circuit 6 shown in FIG. 4.

Drain terminals of the pMOS transistors Mb1 and Mb4 are connected together to the output terminal VCM. An output common mode reference voltage is fed to the gate terminals of Mb1 and Mb4 and is set to a ground voltage to ensure a large output voltage swing which is the value of positive or negative saturation voltage of the OP AMP. To do this, $V_{dd}$ and $V_{ss}$ are set to have a same absolute value with opposite polarities.

Specifically, the transistors Mb1 and Mb2 form a differential input stage with a pMOS transistor Mb5 attached thereto as a current source. The nMOS transistors Mb7 and Mb8, each operating as an active load, together with Mb1 and Mb2 function as an amplifier for one of the differential input so as to provide a current which is proportional to V1 and has a same sign as V1 on the VCM terminal.

When the input voltage V1 is larger than a common mode reference voltage, the output current from the VCM terminal is increased to thereby increase the VCM voltage; whereas, when the input voltage V1 is smaller than a common mode reference voltage, the output current from the VCM terminal is decreased to thereby decrease the VCM voltage.

Similarly, the transistors Mb3 and Mb4 form a second differential input stage. The transistors Mb3 and Mb4, together with Mb7 and Mb8, also function as an amplifier. The output terminal of the second amplifier, i.e., the drain terminal of Mb4, is coupled to that of Mb7 which becomes the output terminal of the amplifier comprised of Mb1, Mb2, Mb7 and Mb8.

Finally, a current proportional to (V1+V2) and having a same sign as (V1+V2) is developed on the VCM terminal. Since the V1 and V2 terminals are coupled to the terminals $V_{o+}$ and $V_{o-}$ shown in FIG. 1, a voltage proportional to the output common mode voltage $(V_{o+}+V_{o-})/2$ subtracted by the common mode reference voltage is developed on the VCM terminal.

Referring back to FIG. 1, the output voltages $V_{o+}$ and $V_{o-}$ are coupled, through the common source amplifier of M10 and M11 and the common gate amplifier including M8 and M9, to the VCM terminal voltage common source, respectively, making the sign of the VCM voltage opposite that of $V_{o+}$ and $V_{o-}$. Therefore, the CMFB circuit shown in FIG. 4, as it is connected to the circuit of FIG. 1, forms a negative feedback loop for the output common mode voltage, to thereby make it equal to the common mode reference voltage.

For the CMFB circuit 6 shown in FIG. 4 to perform the CMFB operation, all transistors included therein should operate in their respective saturation region. Therefore, the input voltages V1 and V2 are restricted between a lower limit, $V_{ss}+V_{SAT}(Mb8)+|V_{TH}(Mb8)|-|V_{TH}(Mb2)|$
and an upper limit, $V_{dd}-V_{DSAT}(Mb5)-V_{DSAT}(Mb2)-|V_{TH}(Mb2)|$,
wherein $V_{TH}$ and $V_{DSAT}$ denote a threshold voltage and a drain-source saturation voltage of a MOS transistor, respectively. When a drain-source voltage is larger than the drain-source saturation voltage, the MOS transistor operates in a saturation region. The drain-source saturation voltage is determined as an absolute value of the difference between a gate-source voltage $V_{GS}$ and the threshold voltage $V_{TH}$.

Although the lower limit of the input voltage dose not impose a serious problem, the restriction on the upper limit of the input voltage makes the CMFB circuit 6 unsuitable for an application circuit with a low voltage supply. As the range of input voltage guaranteeing the CMFB operation is limited, so is the overall linear output voltage range of the OP AMP.

Specifically, in case the input voltages V1 and V2 of the CMFB 6 circuit shown in FIG. 4 exceed a certain limit, the CMFB sampling circuit will not function properly and there is no guarantee that the VCM terminal voltage will be proportional to the difference between the common mode voltage (V1+V2)/2 and the common mode reference voltage. Consequently, the linear operation range for the output voltages $V_{o+}$ and $V_{o-}$ shown in FIG. 1 is limited because they are determined according to the VCM voltage, severely hampering the utility thereof in low voltage circuits having, e.g., a supply voltage lower than 4 volts.

SUMMARY OF THE INVENTION

It is, therefore, a primary object of the present invention to provide a fully differential cascode OP AMP employing an adaptive biasing circuit to eliminate the effect of a slew rate, thereby increasing the operation speed of the OP AMP while maintaining a high DC voltage gain.

Another object of the present invention is to provide a common mode feedback circuit with a large input common mode voltage range, thereby maximizing a linear output voltage swing range thereof.

In accordance with the present invention, there is provided a common mode detector, in response to a first input signal, a second input signal and a common mode reference voltage, for providing an output voltage signal proportional to a common mode voltage which is an average value of the first and the second input signals subtracted by the common mode reference signal, the detector comprising:

a nMOS input stage differential amplifier and a pMOS input stage differential amplifier which are connected in parallel, wherein the nMOS and the pMOS input stage differential amplifiers provide a first and a second current outputs, respectively, which are proportional to the common mode voltage; and a push-pull CMOS amplifier for converting the first and the second current outputs to the output voltage signal.

BRIEF DESCRIPTION OF THE DRAWINGS

The above and other objects and features of the present invention will become apparent from the following description of preferred embodiments given in conjunction with the accompanying drawings, in which:

FIG. 14 constructs a plot wherein the transient characteristic of the prior art CMOS OP AMP is compared with that of the present invention.

DETAILED DESCRIPTION OF THE PREFERRED EMBODIMENTS

Figure 5:
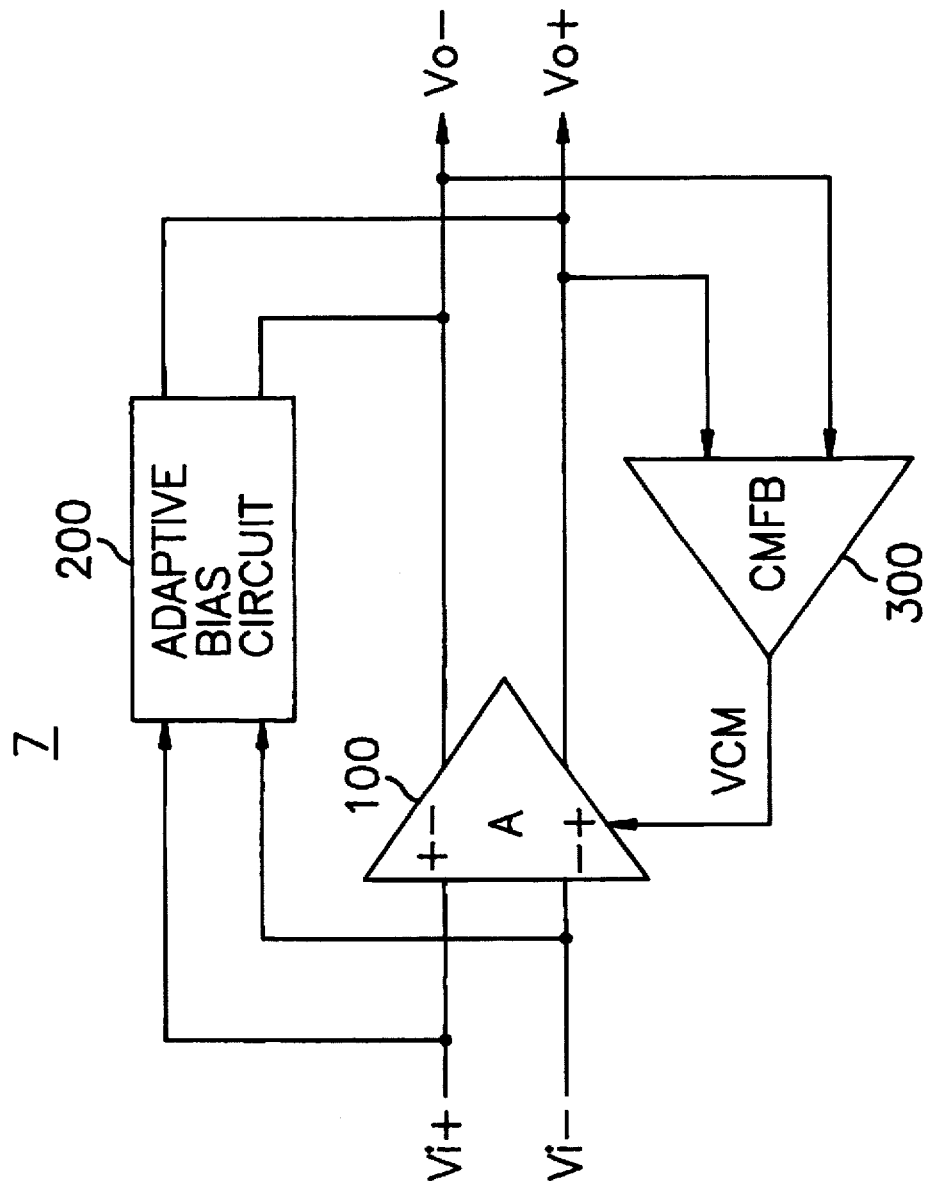
FIG. 5 presents a block diagram of the OP AMP of the present invention employing an adaptive bias circuit and a CMFB circuit.

Referring to FIG. 5, there is shown a block diagram of OP AMP 7, a fully differential OP AMP, of the present invention employing an adaptive bias circuit 200 and a CMFB circuit 300.

It includes an amplifier circuit 100 having a substantially similar structure to that of a prior art folded cascode OP AMP; an adaptive bias circuit 200 which enables a high speed operation of the OP AMP of the present invention by increasing an output current without diminishing an output resistance and a DC voltage gain of the amplifier circuit 100; and a CMFB circuit 300 which sets the common mode voltage $(V_{o+}+V_{o-})/2$ to a common mode reference voltage by using a negative feedback, thereby making the output voltages $V_{o+}$ and $V_{o-}$ swing symmetrically about the common mode reference voltage. The CMFB circuit 300 serves to increase the output voltage range of the overall OP AMP 7.

Figure 6:
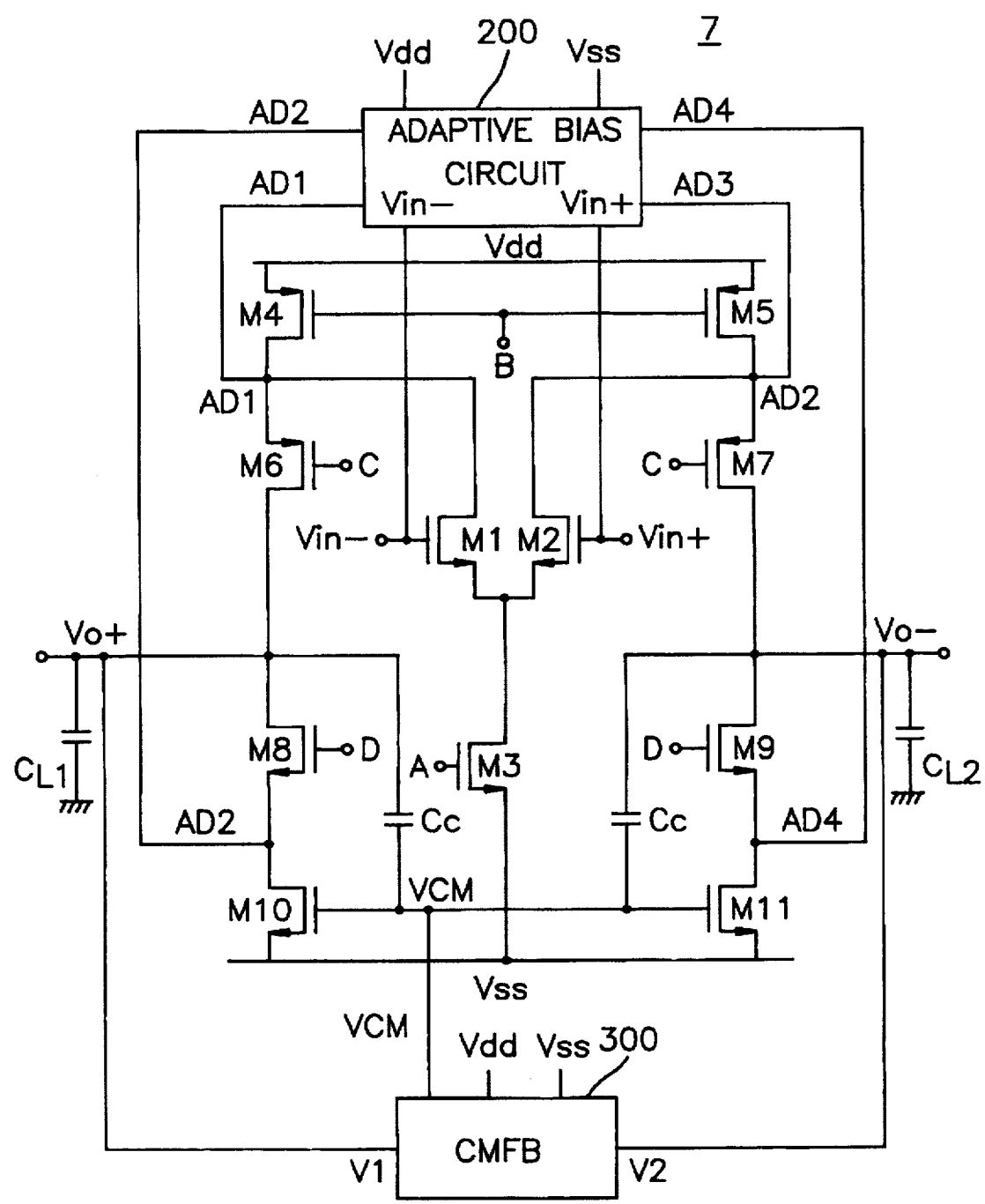
FIG. 6 depicts a more detailed circuit diagram of the OP AMP of the present invention shown in FIG. 5.

Turning now to FIG. 6, there is depicted an exemplary, more detailed circuit diagram of the OP AMP shown in FIG. 5. The adaptive bias circuit 200 and the CMFB circuit 300 in accordance with the present invention may be applied to other fully differential CMOS OP AMPs of various structures. In the preferred embodiment shown in FIG. 6, a prior art fully differential folded cascode CMOS OP AMP is advantageously employed as the amplifier circuit 100 of FIG. 5 for better performance. The operation of a circuit including transistors M1 to M11 and their connections is just the same as that given above with reference to FIG. 1.

The adaptive bias circuit 200 in accordance with the present invention shares input terminals ($V_{in+}$ and $V_{in-}$) and supply voltage terminals ($V_{dd}$ and $V_{ss}$) with the overall OP AMP circuit 7 of the present invention. The four output terminals AD1 to AD4 are coupled to the respective drains of the current source transistors (M4, M5, M10, M11), thereby adding the output current of the adaptive bias circuit to the current of the current source transistors.

The CMFB circuit 300 in accordance with the present invention also shares the supply voltage terminals ($V_{dd}$ and $V_{ss}$) with the overall OP AMP circuit 7 and its input terminals (V1 and V2) and output terminal VCM are coupled to the output terminals ($V_{o+}$ and $V_{o-}$) and the CMFB voltage terminal VCM of the OP AMP 7, respectively.

Figure 7:
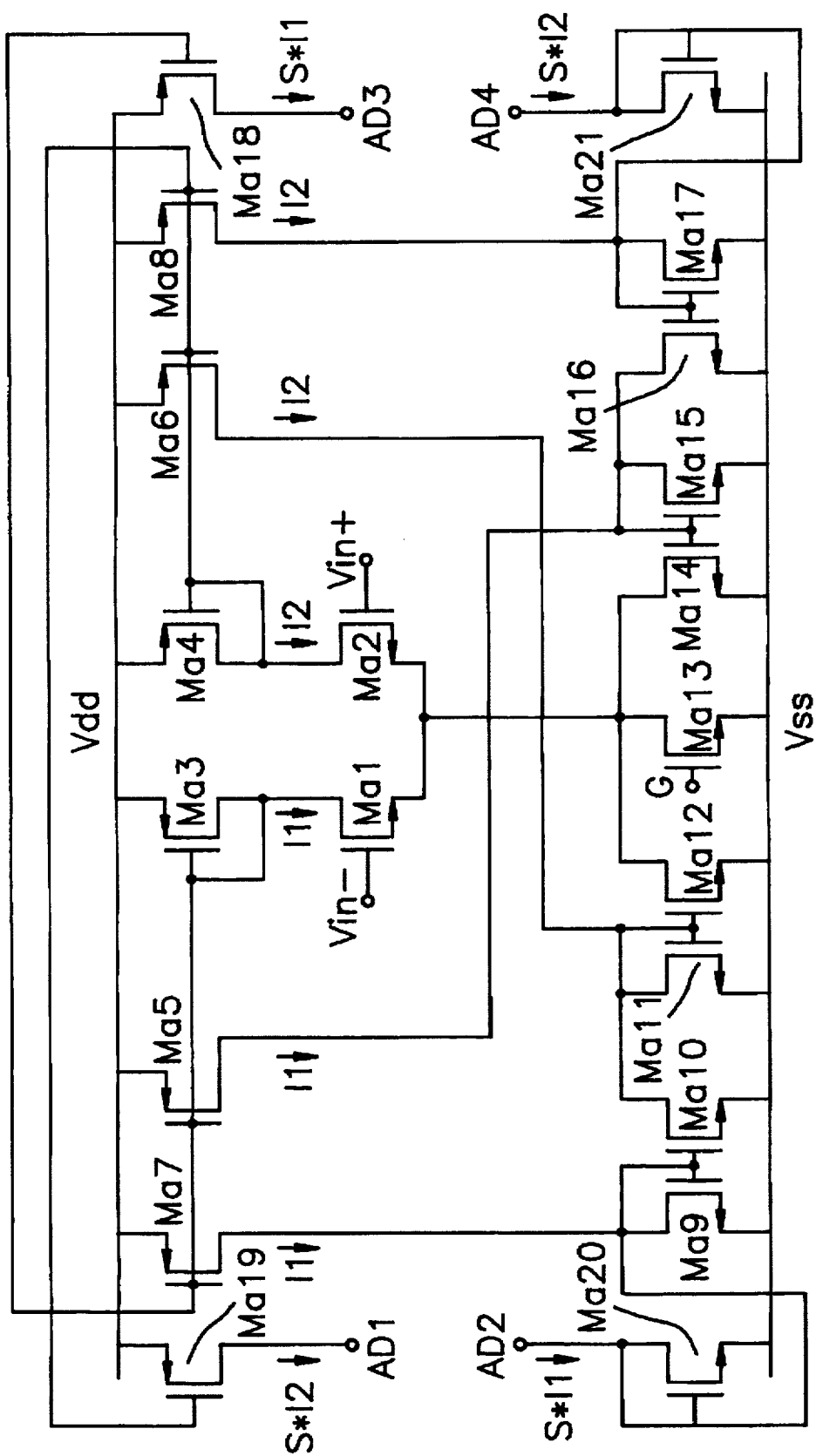
FIG. 7 offers a circuit diagram of the adaptive bias circuit shown in FIG. 6.

In FIG. 7, there is presented a circuit diagram of the adaptive bias circuit 200 shown in FIG. 6. The adaptive bias circuit 200 in accordance with the present invention includes 21 MOS transistors (Ma1–Ma21) and performs a similar function to that of the circuit shown in FIG. 2. Specifically, a portion of the adaptive bias circuit shown in FIG. 7 including Ma1 to Ma17 corresponds exactly to that of FIG. 2, with a difference that Ma18 to Ma21 of the inventive adaptive bias circuit 200 form current output terminals while their counterparts in the prior art adaptive bias circuit shown in FIG. 2 form voltage amplifying circuits.

With its four output terminals AD1 to AD4 coupled to the respective drains of the current source transistors (M4, M5, M10, M11), the adaptive bias circuit 200 enables a high speed operation of the OP AMP 7 by increasing the output current during a transition state without diminishing the output resistance and the DC voltage gain of the amplifier circuit 100 or adversely affecting the frequency characteristic thereof.

Figure 2:
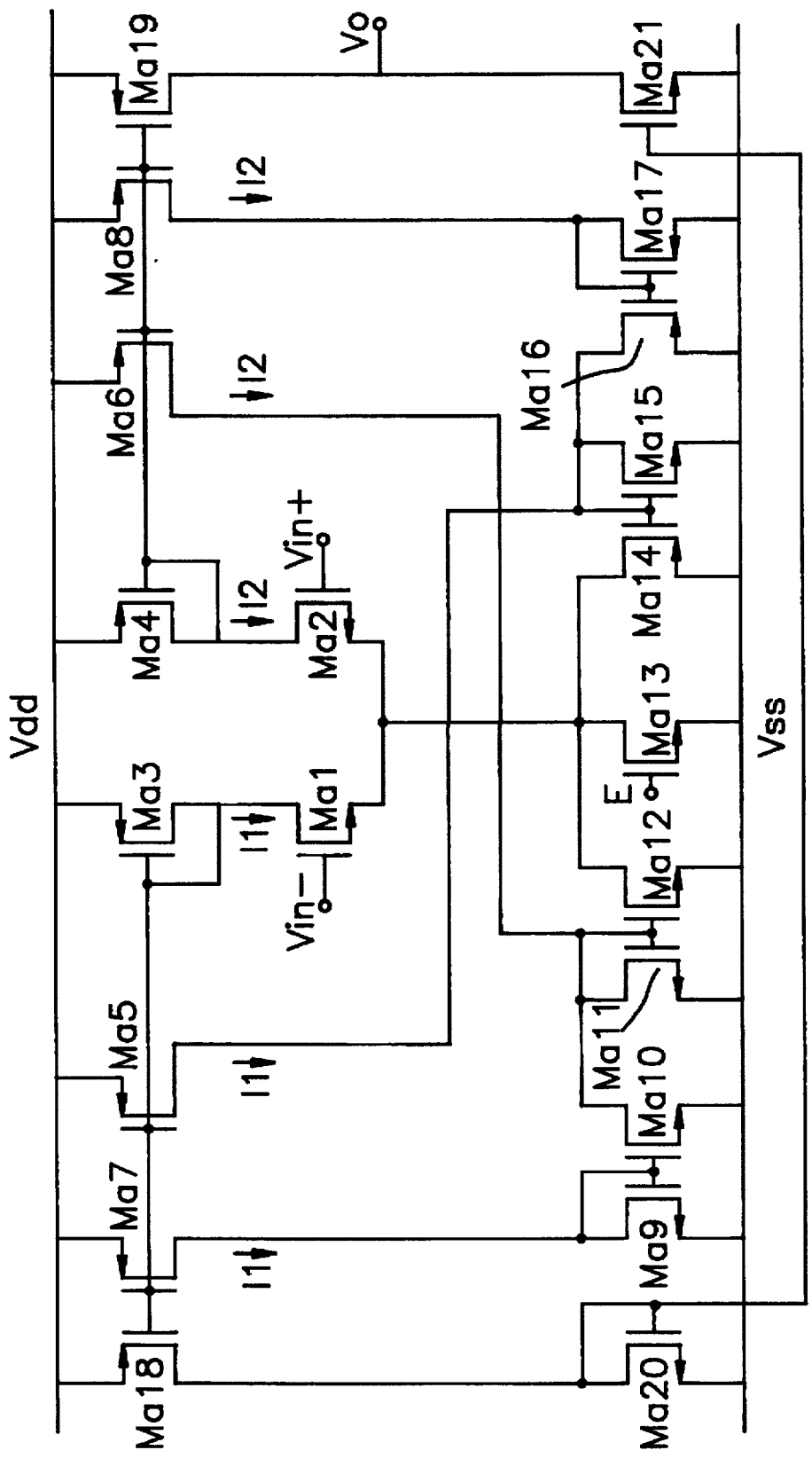
FIG. 2 represents a circuit diagram of a conventional OTA employing an adaptive bias circuit.
Figure 3:
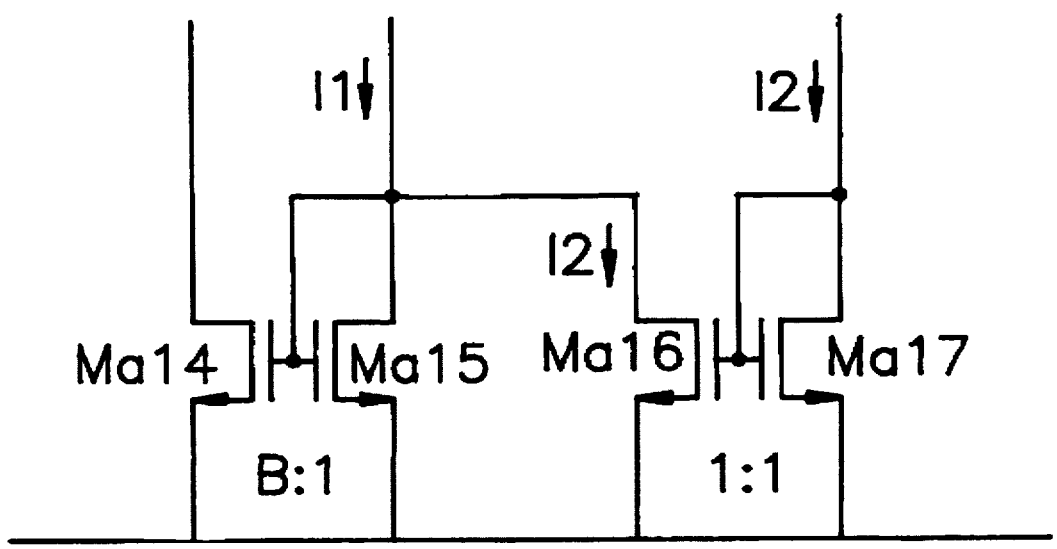
FIG. 3 describes the current subtraction circuit shown in FIG. 2.

Owing to the similarity in structures, the circuits shown in FIG. 7 and FIG. 2 perform a substantially identical function except the form of the output thereof. The conventional OTA circuit shown in FIG. 2 includes a push-pull CMOS amplifier circuit which connects the current mirror circuits formed by transistor pairs Ma4, Ma19; Ma3, Ma18; and Ma20, Ma21, and the drains of Ma19 and Ma21 and provides an output voltage on the terminal $V_o$. Meanwhile, the adaptive bias circuit 200 shown in FIG. 7 provides output currents on the four output terminals (AD1 to AD4) with the help of the four current mirrors formed by the transistor pairs Ma3, Ma18; Ma4, Ma19; Ma9, Ma20; and Ma17, Ma21.

Specifically, the pMOS transistors Ma4, Ma6 and Ma8 form current mirrors. Therefore, the current fed from either of the transistors Ma6 and Ma8 will have a same value I2 as that of Ma4 and Ma2, assuming that the MOS resistance is infinite while the circuit is in a linear operation mode, i.e., all MOS transistors operate in a saturation region and the transistors Ma4, Ma6, and Ma8 have a same channel width to length ratio.

With a similar assumption, the current from either of the transistors Ma5 and Ma7 will have a same value I1 as that of Ma3 and Ma1.

As shown, the four transistors Ma14 to Ma17 form one current subtraction circuit, and Ma9 to Ma12 form another current subtraction circuit. During a transition state, the two subtraction circuits bring about a large difference between the current values I1 of Ma1 and I2 of Ma2, entailing a large amount of current flowing through one of the transistors Ma12 and Ma14. These subtraction circuits operate as a positive feedback circuit for causing a large difference between I1 and I2 during the transition state.

The gates of Ma3 and Ma9 are coupled to the gates of Ma18 and Ma20, respectively, to form current mirrors; and a current proportional to I1 flows through Ma18 and Ma20 by the operation of the current mirrors. The operation of Ma4, Ma17, Ma19 and Ma21 is identical to that of Ma3, Ma9, Ma18 and Ma20. Therefore, assuming that the channel width to length ratios of Ma18, Ma19, Ma20 and Ma21 are S times larger than that of Ma3, Ma4, Ma9 and Ma17, respectively, the drain currents of Ma18 and Ma20 become equal to S·I1, and those of Ma19 and Ma21 equal to S·I2. With a large S, large output currents of the adaptive bias circuit 200 can be obtained: namely, large currents are provided from the current sourcing terminals AD1 and AD3 and drawn to the current sinking terminals AD2 and AD4.

Figure 8:
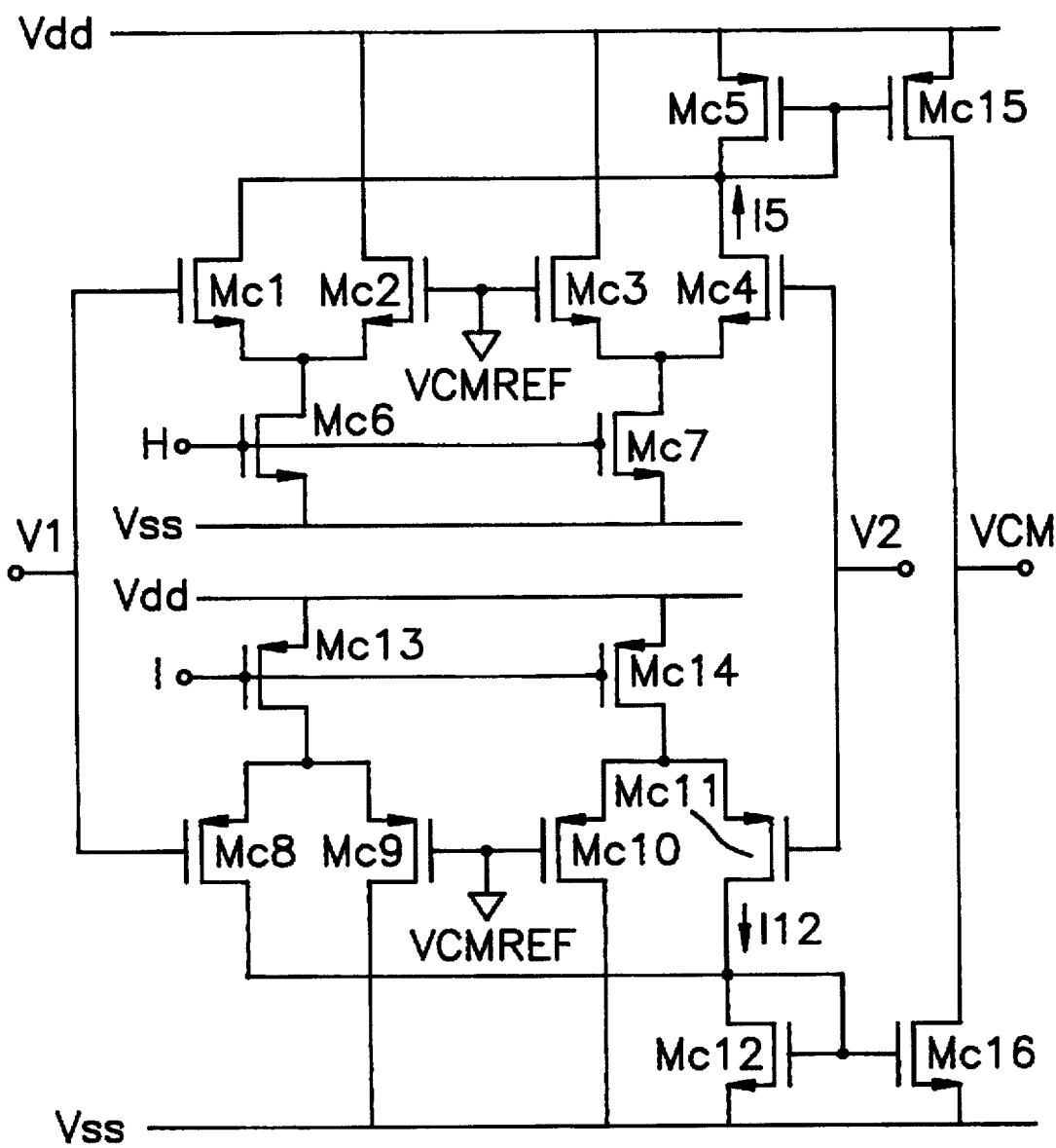
FIG. 8 illustrates a circuit diagram of the CMFB circuit shown in FIG. 6.

Referring to FIG. 8, there is depicted a circuit diagram of the CMFB circuit 300 shown in FIG. 6, which provides a common mode voltage on the VCM terminal thereof. The CMFB circuit 300 includes a pMOS input stage amplifier consisting of Mc1 to Mc7 and a nMOS input stage amplifier consisting of Mc8 to Mc14 which provide current outputs responsive to voltage inputs. It further includes a push-pull CMOS amplifier, consisting of Mc15 and Mc16, which is connected to the two input stage amplifiers to convert the current outputs thereof to a voltage output on the VCM terminal. Owing to the pMOS and nMOS input stage amplifiers, the CMFB circuit 300 features a large input voltage range.

Two input terminals V1 and V2 of the CMFB circuit 300 are coupled to the output terminals $V_{o+}$ and $V_{o-}$ of the OP AMP 7. Its output voltage is fed back to the VCM terminal of the OP AMP 7, to make the common mode component of the output voltages, $(V_{o+}+V_{o-})/2$, identical to the common mode reference voltage denoted as VCMREF in FIG. 8 and, hence, to make the two output voltages $V_{o+}$ and $V_{o-}$ swing symmetrically about the reference voltage VCMREF.

Figure 4:
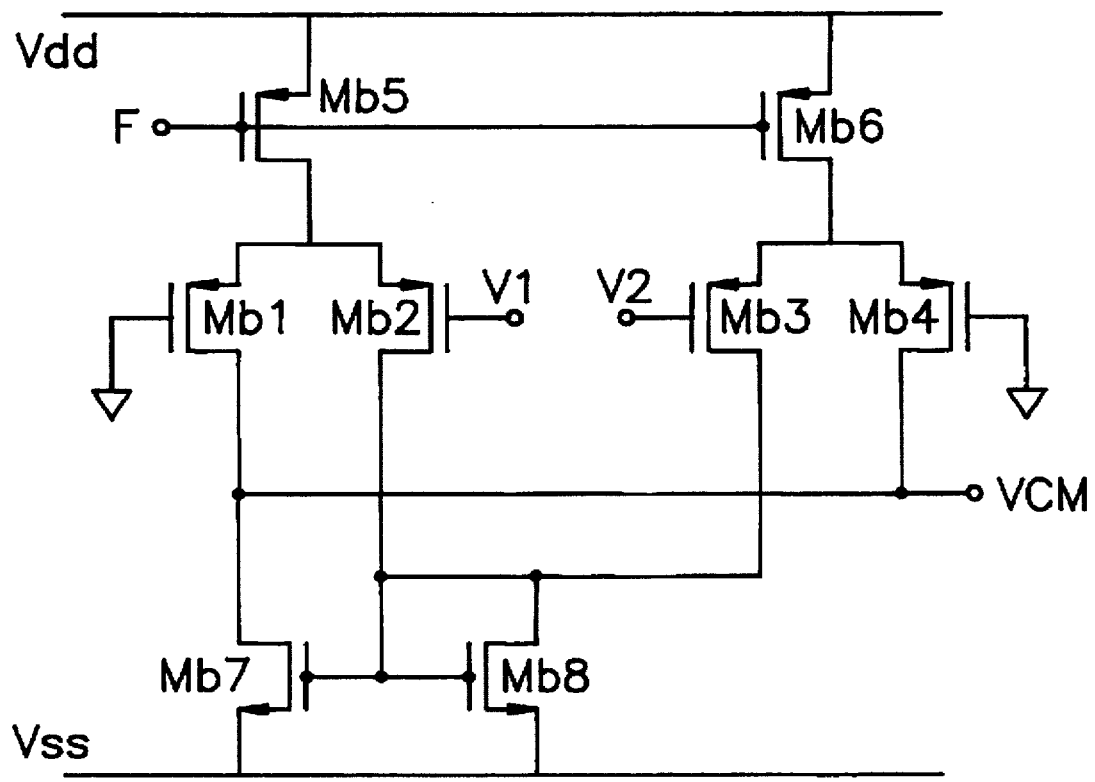
FIG. 4 shows a conventional CMFB circuit.

The transistors Mc8 to Mc14 form a pMOS amplifier which operates in a similar manner as the prior art CMFB circuit shown in FIG. 4. It acts as an OTA which provides an output current I2 responsive to the input voltages V1 and V2. The input voltages V1 and V2 are applied to the gates of Mc8 and Mc11, respectively, and the common mode reference voltage VCMREF is applied to the gates of Mc9 and Mc10. Consequently, the transistors Mc8 to Mc11 make two differential input stages, wherein VCMREF is set to a ground voltage.

Assuming that the channel widths of the transistors Mc8 to Mc11 and the channel lengths thereof are the same, a small signal output current I12 may be defined as follows:

$$I12 = -g_{Mc8} \cdot \{(V1+V2)/2 - VCMREF\} \quad \text{Eq. 5}$$

wherein $g_{Mc8}$ is a transconductance value of Mc8 to Mc11 and VCMREF is 0 in this particular embodiment.

Since the transistors Mc1 to Mc7 have the same structure as Mc8 to Mc14, a current flowing through M5 can be represented as follows:

$$I5 = -g_{Mc1} \cdot \{(V1+V2)/2 - VCMREF\} \quad \text{Eq. 6}$$

wherein $g_{Mc1}$ is a transconductance value of Mc1 to Mc4 under the assumption of same channel widths of the transistors Mc1 to Mc4 and same channel lengths thereof.

Representing the channel width-to-length ratios of Mc5, Mc15, Mc12 and Mc16 as $(W/L)_5$, $(W/L)_{15}$, $(W/L)_{12}$ and $(W/L)_{16}$, respectively, a small signal output voltage VCM may be written as follows:

$$VCM = + \left\{ g_{Mc1} \cdot \frac{(W/L)_{15}}{(W/L)_5} + g_{Mc8} \cdot \frac{(W/L)_{15}}{(W/L)_{12}} \right\} \cdot \quad \text{Eq. 7}$$

$$(r_{o15} \| r_{o16}) \cdot \left( \frac{V1+V2}{2} - VCMREF \right)$$

wherein $r_{o15}$ and $r_{o16}$ are output resistance values of Mc15 and Mc16, respectively, and a leftmost "+" signifies that $\{(V1+V2)/2 - VCMREF\}$ has a same sign with the VCM voltage.

Owing to the parallel connection of the pMOS and nMOS input stage amplifiers, an input voltage range ensuring a linear operation of the CMFB circuit 300 is extended, thereby enlarging the output voltage swing range of the OP AMP 7.

Specifically, the input voltage of the nMOS amplifier consisting of Mc1 to Mc7 is limited to a range from its minimum value, $V_{ss} + V_{DSAT}(MC6) + |V_{TH}(MC1)| + V_{DSAT}(MC1)$ to its maximum value, $V_{dd} - V_{DSAT}(Mc5) - |V_{TH}(Mc5)| + V_{TH}(Mc1)|$.

The drain-source saturation voltage $V_{DSAT}$ can be made small by increasing the channel width-to-length ratio of a corresponding transistor, although the threshold voltage $V_{TH}$ is a fixed value of, e.g., 0.6–1.0 volt, for a commercially available CMOS fabrication technique. The large value of the lower limit results in the defect that the nMOS amplifier operates only for relatively large values of V1 and V2.

On the other hand, the input voltage range of the pMOS amplifier consisting of Mc8 to Mc14 is limited from its minimum value, $V_{ss} + V_{DSAT}(MC12) + |V_{TH}(MC12)| - |V_{TH}(MC8)|$ to its maximum value, $V_{dd} - V_{DSAT}(Mc13) - |V_{TH}(Mc8)| - |V_{DSAT}(Mc8)|$.

Therefore, a smaller upper limit will result in the deficiency that the pMOS amplifier operates only for relatively low values of V1 and V2.

Since the pMOS and the nMOS input stage amplifiers are connected in parallel and their output terminals are coupled by the push-pull amplifier consisting of M15 and M16, the pMOS amplifier operates in case the input voltages are low and the nMOS amplifier operates in case the input voltages are high, thereby enabling the CMFB circuit 300 to operate over a wide range practically covering almost all input voltages.

The above equations of a small signal output voltage VCM are valid as long as both the nMOS and the pMOS amplifiers are operating. In case the nMOS amplifier alone is operating, the term $g_{Mc1}$ remains included in the VCM equation while the term $g_{Mc8}$ is discarded therefrom. Similarly, in case only the pMOS amplifier is operating, only $g_{Mc8}$ will remain in the VCM equation.

Using a well-known circuit simulation program such as HSPICE, the circuits presented above can be simulated with $V_{dd}$ and $V_{ss}$ set to 1.2 volt and −1.2 volt, respectively. Parameters used for the simulation are the same as those used for the 0.8 micron digital CMOS fabrication process which are currently used in an ASIC (Application Specific Integrated Circuit) design. The results of the simulation are shown in FIGS. 9 to 14.

Figure 9:
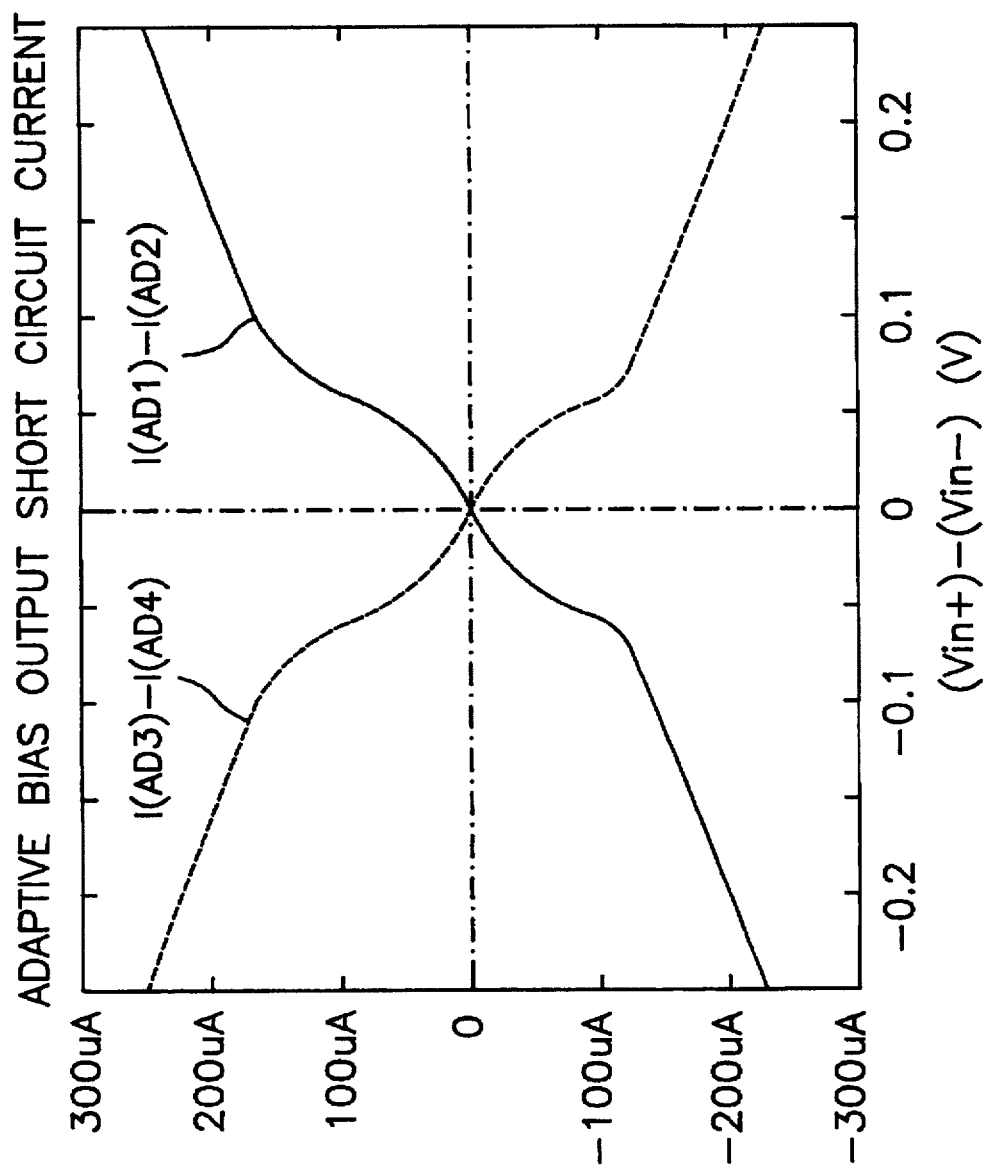
FIG. 9 explains a transfer characteristic of the adaptive bias circuit shown in FIG. 7.

Referring to FIG. 9, there is depicted a simulation result showing a transfer characteristic of the adaptive bias circuit shown in FIG. 7. It shows an output short circuit current with varying differential input voltage $(V_{in+} - V_{in-})$, wherein the output short circuit current is a current flowing from the output terminals to ground, assuming that the output terminals (AD1 to AD4) are connected to the ground.

Referring back to FIG. 6, the current $\{I(AD1)-I(AD2)\}$ depicted in a solid line flows from the terminal $V_{o+}$ to a load capacitor and the current $\{I(AD3)-I(AD4)\}$ denoted in a dashed line flows from the terminal $V_{o-}$ to a load capacitor. As shown, a larger current is provided by the adaptive bias circuit as the input voltage difference $(V_{in+} - V_{in-})$ increases, resulting in an increased slew rate and a fast response of the output voltages $V_{o+}$ and $V_{o-}$.

Figure 10:
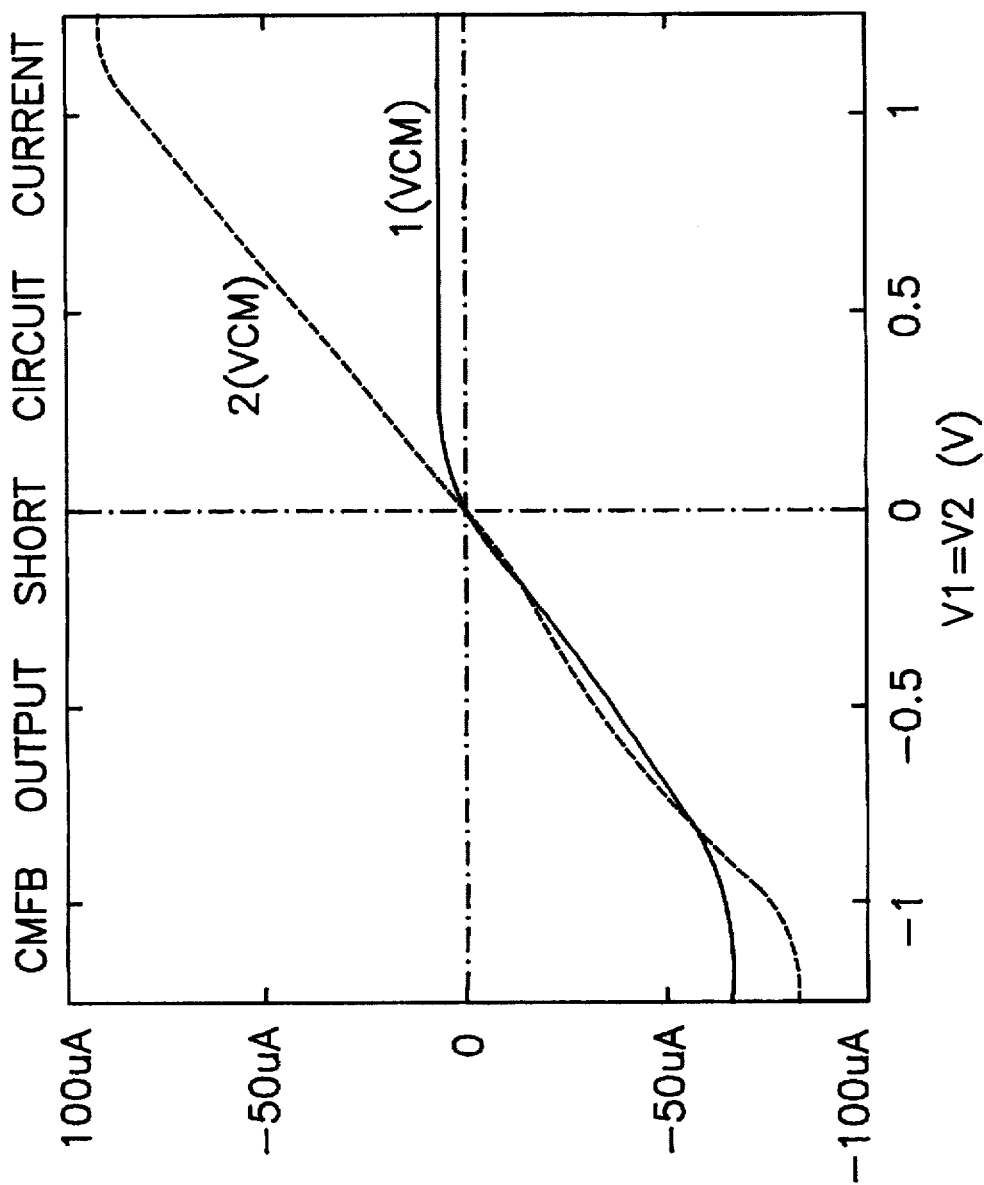
FIG. 10 graphically demonstrates the difference of characteristics between the prior art CMFB circuit and the present invention.

FIG. 10 graphically demonstrates the difference of characteristics between the prior art CMFB circuit shown in FIG. 4 and that of the present invention shown in FIG. 8. It shows an output short circuit current which flows from the output terminal VCM to ground when the output terminal VCM is connected to the ground while varying the common mode component of the input voltage $\{(V1+V2)/2\}$. The output characteristic of the prior art CMFB is presented in a solid line while that of the present invention is represented in a dashed line.

It can be seen from FIG. 10 that the range of the input voltage difference of the prior art CMFB circuit is limited between −1 volt to +0.2 volt while that of the present invention ranges from −1.1 volt to 1.1 volt.

Figure 1:
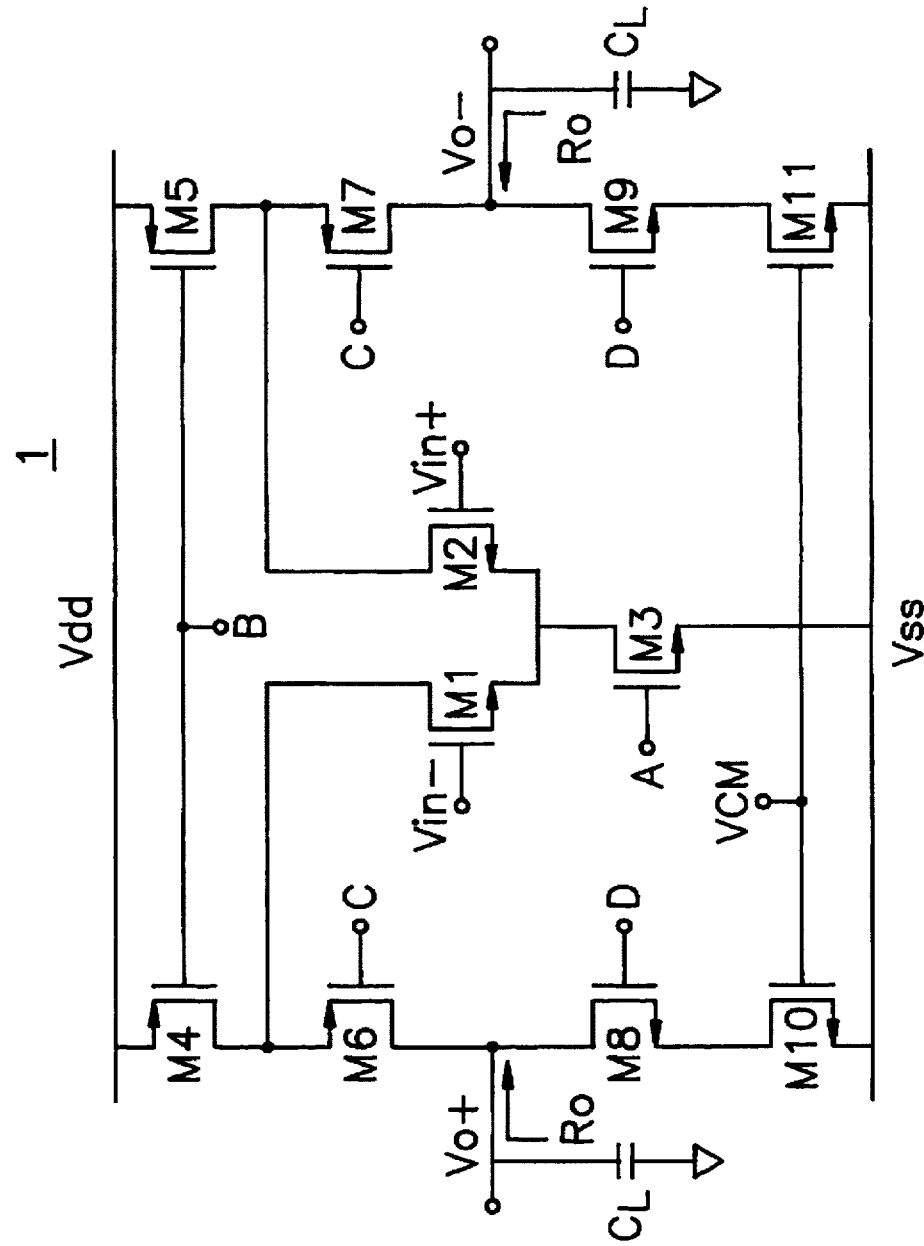
FIG. 1 provides a circuit diagram of a conventional fully differential folded cascode CMOS OP AMP.
Figure 11:
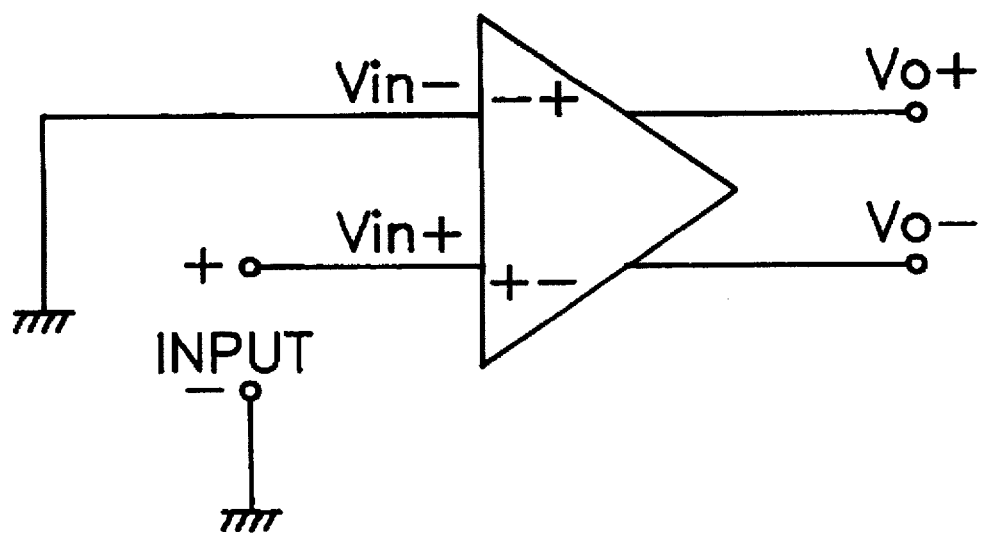
FIG. 11 exhibits a circuit for comparing the DC transfer characteristics of the prior art CMOS OP AMP with that of the present invention.

Referring to FIG. 11, there is shown a circuit 410 for comparing the DC transfer characteristics of the prior art CMOS OP AMP shown in FIG. 1 with those of the present invention shown in FIG. 6. $V_{in+}$, $V_{in-}$, $V_{o+}$ and $V_{o-}$ are the input and output terminals of OP AMPs shown in FIG. 1 and FIG. 6. As shown in FIG. 11, input terminal $V_{in+}$ is set to a ground position and an input voltage is applied to the $V_{in-}$ terminal.

Figure 12:
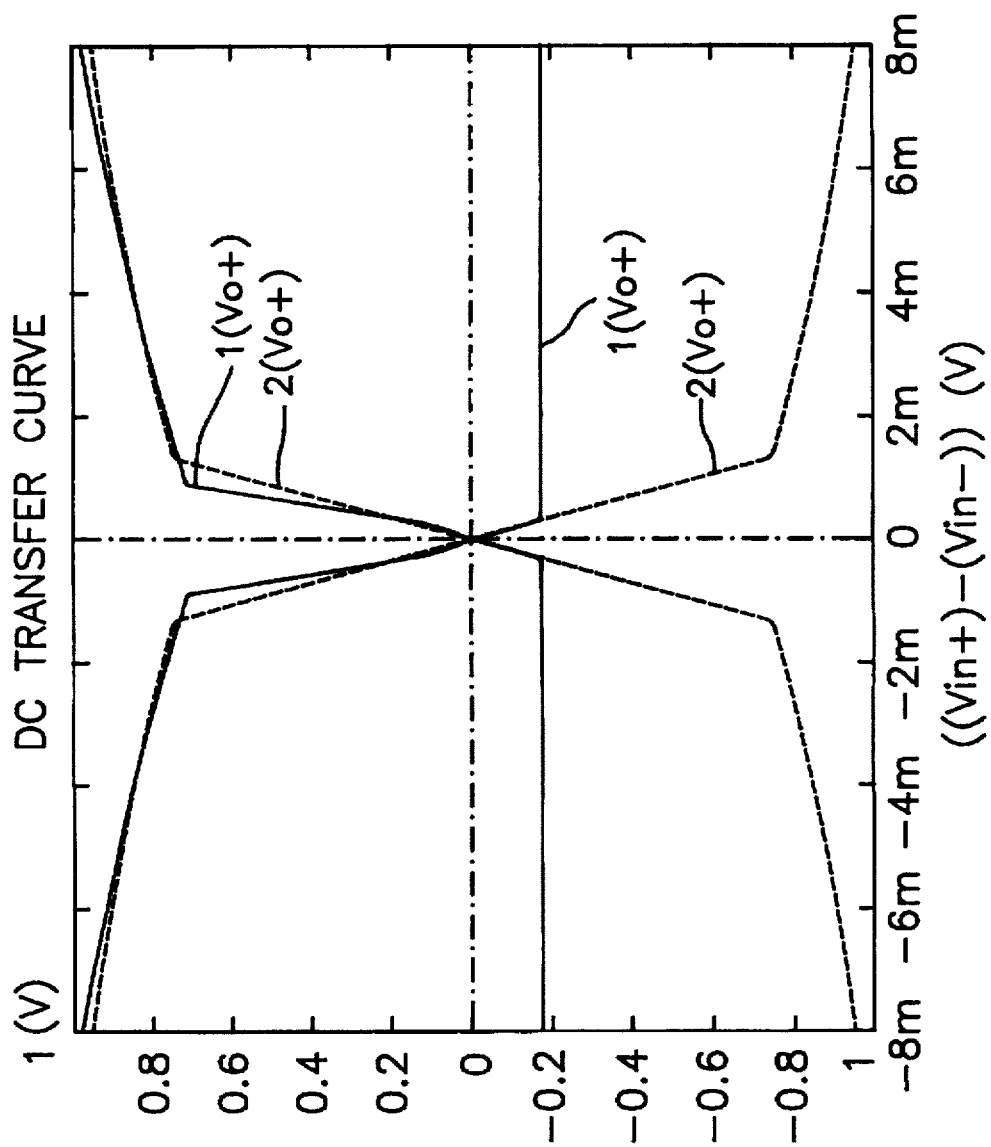
FIG. 12 displays a plot wherein the DC transfer characteristic of the prior art CMOS OP AMP is compared with that of the present invention.

FIG. 12 depicts the result of a comparison of the DC transfer characteristics of the prior art CMOS OP AMP with those of the present invention by using the circuit 410 shown in FIG. 11.

In FIG. 12, solid lines numbered as 1 represent the characteristics of the prior art CMOS OP AMP shown in FIG. 1 combined with the prior art CMFB circuit shown in FIG. 4 and dashed lines numbered as 2 represent the characteristics of the inventive CMOS OP AMP shown in FIG. 6. The output voltage of the present invention ranges from −0.7 volt to 0.7 volt, while that of the prior art OP AMP ranges from −0.2 volt to 0.7 volt. Since the input voltage range of the prior art CMFB circuits is limited to a range from −1.0 volt to 0.2 volt as shown in FIG. 10, the output voltage swing range of the prior art OP AMP is limited as shown in FIG. 12.

The lower limitation on the output voltage of the prior art CMFB circuit 6 shown in FIG. 4 is believed to result from the following reasons. The CMFB circuits 6 provide on the terminal VCM an output voltage which is proportional to the difference between the common mode component, i.e., the OP AMP output voltages and the common mode reference voltage, i.e., $\{(V_{o+}+V_{o-})/2-VCMREF\}$ and has a same sign. However, a voltage with its sign opposite that of VCM is developed on the terminals $V_{o+}$ and $V_{o-}$ through the cascode amplifier consisting of M8 to M11 shown in FIG. 1. Therefore, the prior art CMFB circuit 6 connected to the transistors M8 to M11 constructs a negative feedback loop, thereby making the common mode voltage $(V_{o+}+V_{o-})/2$ equal to the common mode reference voltage. As shown in FIG. 10, the upper limit for the input voltage of the prior art CMFB circuit 6 is around +0.2 volt. Therefore, in case $V_{o+}$ is larger than +0.2 volt and $V_{o-}$ is smaller than −0.2 volt, the input voltage V1 of the CMFB circuit 6 exceeds its limit and the small signal voltage gain (VCM/V1) becomes 0. Consequently, a loop gain of the negative feedback loop including the voltage terminal $V_{o+}$ (or V1) becomes 0 and, therefore, the output voltage $V_{o+}$ of the OP AMP becomes out of control.

On the other hand, since $V_{o-}$, which is coupled to the input terminal V2 of the CMFB circuit 6 shown in FIG. 4, is still smaller than −0.2 volt, it lies within the linear operation range of the CMFB circuit 6. Since the small signal voltage gain (VCM/V2) becomes a large value, a loop gain of the negative feedback loop including the voltage terminal $V_{o-}$ (or V2) becomes large and, therefore, the output voltage $V_{o-}$ of the OP AMP 7 is under control. In the CMFB circuit 6, the output voltage terminal $V_{o+}$, whose value is larger than 0.2 volt, produces a same result with that of 0.2 volt as shown in FIG. 10. With a $V_{o+}$ larger than 0.2 volt, the negative feedback loop containing the other output terminal $V_{o-}$ is still operating and equalizing the common mode voltage $\{(V_{o+}+V_{o-})/2\}$ with the common mode reference voltage VCMREF. Consequently, the value of $V_{o-}$ is set to −0.2 volt for all $V_{o+}$ values larger than 0.2 volt under the control of the negative feedback loop. As $V_{o+}$ or $V_{o-}$, whose value is larger than +0.2, is not affected by the negative feedback loop including the CMFB circuit 6 and has the same result as that of +0.2 volt, the OP AMP output voltages $V_{o+}$ and $V_{o-}$ cannot be smaller than −0.2.

In summary, in case the prior art CMFB circuit 6 is used in a fully differential CMOS OP AMP, the limitation on the linear input range of the CMFB circuit 6 results in a limitation on the output voltage range of the CMOS OP AMP.

Figure 13:
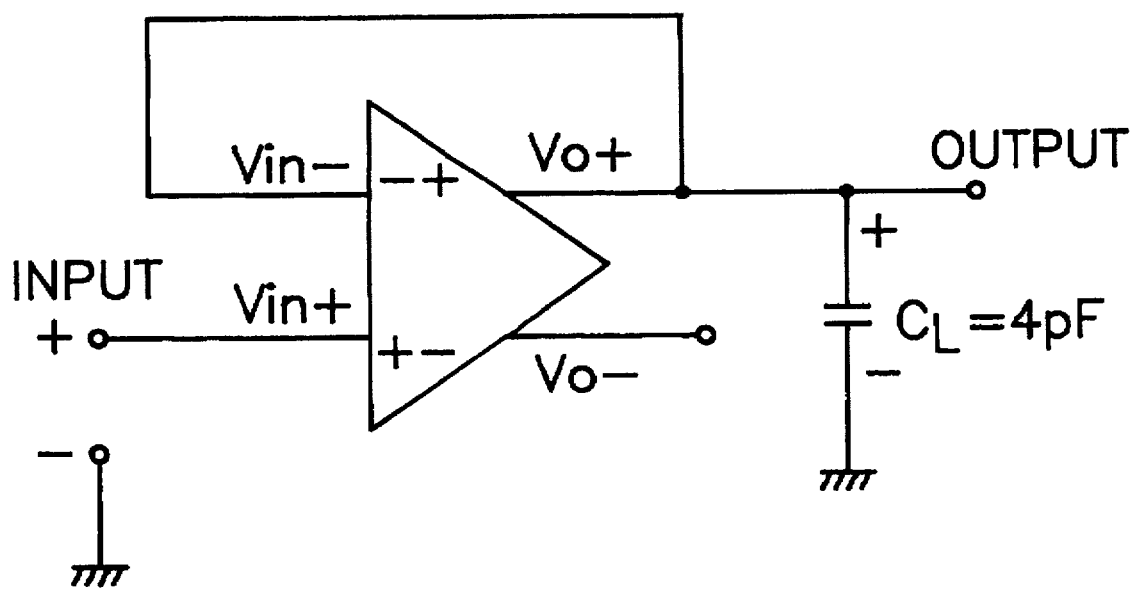
FIG. 13 exemplifies a circuit for comparing the transient characteristic of the prior art CMOS OP AMP with that of the present invention.

Referring to FIG. 13, there is shown a simulation circuit 420 for comparing the transient characteristics of the prior art CMOS OP AMP with those of the CMOS OP AMP 7 of the present invention shown in FIG. 6. $V_{in+}$, $V_{in-}$, $V_{o+}$ and $V_{o-}$ are the input and output terminals of OP AMPs shown in FIG. 1 and FIG. 6. It is a unity gain feedback circuit of a voltage gain 1 with a 4 pF capacitive load attached to an output voltage terminal.

Referring to FIG. 14, there is shown a plot for comparing the transient characteristics of the prior art CMOS OP AMP with those of the present invention. When a step input swinging from 0 volt to 0.5 volt is applied to the input terminal of the circuit 420 shown in FIG. 13, waveforms shown in FIG. 14 are developed at the output terminal of the circuit 420.

In FIG. 14, a dashed line (1) depicts the output voltage waveform of the prior art CMOS OP AMP which is a combination of the circuits shown in FIG. 1 and FIG. 4; and a solid line (2) represents the output voltage waveform of the CMOS OP AMP 7 of the present invention shown in FIG. 6. The output voltage of the present invention settles down more rapidly than that of the prior art OP AMP. Specifically, in this particular embodiment, 1% settling time of the inventive OP AMP is 20 ns compared with 43 ns of the prior art OP AMP. The decrease in the settling time is due to the increase in the slew rate which is caused by the adaptive bias circuit 200.

In Table 1, simulation results of the prior art OP AMP are compared with those of the OP AMP 7 of the present invention, wherein the prior art OP AMP is a combination of the circuit 1 shown in FIG. 1 and the CMFB circuit 6 shown in FIG. 4. For the simulation circuit, a 4 pF capacitive load is inserted between the output terminals ($V_{o+}$, $V_{o-}$) and ground.

As shown in Table 1, the inventive OP AMP produces marked improvements in various performance categories such as the output swing range, slew rate, and 1% settling time.

TABLE 1

|  | Prior Art | Present Invention |
| --- | --- | --- |
| output swing range | −0.2 – 0.7 | −0.7 – 0.7 |
| DC voltage gain | 53 dB | 55 dB |
| unit gain frequency | 25 MHz | 30 MHz |
| phase margin | 85 | 82 |
| slew rate | 20 V/us | 40 V/us |
| 1% settling time | 43 ns | 20 ns |
| DC power consumption | 1.38 mW | 1.60 mW |

From Table 1, it can be seen that in accordance with the present invention, a high settling speed is achieved with a 16% increase in the DC power consumption and a slight decrease in the phase margin.

A fast settling OP AMP of the present invention can be manufactured by using a currently available digital CMOS fabrication process wherein the threshold voltage of MOS transistors ranges from 0.6 volt to 1.0 volt.

The inventive OP AMP employing the adaptive bias circuit 200 and the CMFB circuit 300 of the present invention features an increased linear output region and a large DC voltage gain and, therefore, is suitable for use with a single voltage supply in a low supply voltage high speed analog signal processing circuit such as an A/D converter fabricated on a same chip with a low-voltage digital circuit, a switched capacitor filter and a disk driver controller.

The OP AMP of the present invention is especially useful in a portable system which uses a battery power supply, requiring a low voltage and low power consumption IC.

While the present invention has been described with respect to the particular embodiments, it will be apparent to those skilled in the art that various changes and modifications may be made without departing from the spirit and scope of the invention as defined in the following claims.

What is claimed is:

1. A common mode detector, in response to a first input signal, a second input signal and a common mode reference voltage, for providing an output voltage signal proportional to a common mode voltage which is an average value of the first and the second input signals subtracted by the common mode reference signal, the detector comprising:

a nMOS input stage differential amplifier and a pMOS input stage differential amplifier which are connected in parallel, wherein the nMOS and the pMOS input stage differential amplifiers provide a first and a second current outputs, respectively, which are proportional to the common mode voltage; and a push-pull CMOS amplifier for converting the first and the second current outputs to the output voltage signal.

2. The common mode detector of claim 1, wherein the nMOS input stage differential amplifier includes a pMOS transistor acting as a diode whose gate terminal and drain terminal are connected together and to which the first current output is applied; and the pMOS input stage differential amplifier includes a nMOS transistor acting as a diode whose gate terminal and drain terminal are connected together and to which the second current output is applied.

3. The common mode detector of claim 2, wherein the push-pull CMOS amplifier includes an output driving nMOS transistor and an output driving pMOS transistor whose drain terminals are connected together, wherein the gate terminal of the output driving nMOS transistor is connected to the gate terminal and the drain terminal of the nMOS transistor acting as a diode and the gate terminal of the output driving pMOS transistor is connected to the gate terminal and the drain terminal of the pMOS transistor acting as a diode.

4. An adaptive bias circuit, in response to a first input voltage and a second input voltage, for providing four output currents, which comprises:

an operational transconductance amplifier for providing a first and a second currents in response to the first input voltage and the second input voltage, respectively;

a first subtractor circuit for adding a current to the first and the second currents, respectively, in case the first current is larger than the second current;

a second subtractor circuit for adding a current to the first and the second currents, respectively, in case the second current is larger than the first current; and four output transistors, each of which provides one of the four output currents, wherein the four output currents include a first output current which is proportional to the first current and of a same sign with the first current; a second output current which is proportional to the first current and of an opposite sign with the first current; a third output current which is proportional to the second current and of a same sign with the second current; and a fourth output current which is proportional to the second current and of an opposite sign with the second current.

* * * * *